(12) United States Patent
Li et al.

(10) Patent No.: US 11,380,827 B2
(45) Date of Patent: Jul. 5, 2022

(54) LIGHT EMITTING DIODE DEVICE AND BACKLIGHT MODULE

(71) Applicant: FOSHAN NATIONSTAR OPTOELECTRONICS CO., LTD, Guangdong (CN)

(72) Inventors: Fuhai Li, Guangdong (CN); Penghui Dong, Guangdong (CN); Dongzi Chen, Guangdong (CN); Zhiguo Xie, Guangdong (CN); Quan Xie, Guangdong (CN)

(73) Assignee: FOSHAN NATIONSTAR OPTOELECTRONICS CO., LTD, Guangdong (CN)

( * ) Notice: Subject to any disclaimer, the term of this patent is extended or adjusted under 35 U.S.C. 154(b) by 0 days.

(21) Appl. No.: 16/908,771

(22) Filed: Jun. 23, 2020

(65) Prior Publication Data

US 2021/0043815 A1   Feb. 11, 2021

(30) Foreign Application Priority Data

Aug. 9, 2019 (CN) .......................... 201910736447.8

(51) Int. Cl.
*H01L 33/60* (2010.01)
*H01L 25/075* (2006.01)
*H01L 33/54* (2010.01)
*H01L 33/52* (2010.01)
*H01L 33/46* (2010.01)
(Continued)

(52) U.S. Cl.
CPC .......... *H01L 33/60* (2013.01); *H01L 25/0753* (2013.01); *H01L 33/54* (2013.01)

(58) Field of Classification Search
CPC ......... H01L 33/60; H01L 33/46; H01L 33/54; H01L 33/52; H01L 2933/0091; F21V 19/00; F21Y 2115/10; G02F 1/133603
See application file for complete search history.

(56) References Cited

U.S. PATENT DOCUMENTS

| | | | |
|---|---|---|---|
| 2005/0002194 A1* | 1/2005 | Kikuchi | H01L 33/60 362/300 |
| 2011/0249215 A1* | 10/2011 | Jung | G02F 1/133611 349/61 |

(Continued)

FOREIGN PATENT DOCUMENTS

| | | |
|---|---|---|
| CN | 101375095 A | 2/2009 |
| CN | 102287690 A | 12/2011 |

(Continued)

OTHER PUBLICATIONS

Corresponding CN application search report dated Jul. 1, 2021.

*Primary Examiner* — Marcos D. Pizarro
*Assistant Examiner* — Antonio B Crite
(74) *Attorney, Agent, or Firm* — Gang Yu (57) ABSTRACT

Provided are a Light Emitting Diode (LED) device and a backlight module. The LED device includes a substrate, a chip, an encapsulation structure and a top reflective shielding layer; the chip is disposed on the substrate; the encapsulation structure covers the substrate and covers the chip; and the top reflective shielding layer is disposed on the encapsulation structure and located at a central position of an upper surface of the encapsulation structure, and covers a part of the upper surface of the encapsulation structure.

16 Claims, 4 Drawing Sheets

(51) Int. Cl.
*F21V 19/00* (2006.01)
*F21Y 115/10* (2016.01)

(56) References Cited

U.S. PATENT DOCUMENTS

2013/0300285 A1\* 11/2013 Ito .......................... H05B 33/02
            313/512
2019/0324190 A1\* 10/2019 Crompvoets ........ G02B 6/0021

FOREIGN PATENT DOCUMENTS

| | | |
|---|---|---|
| CN | 103700758 A | 4/2014 |
| CN | 204668351 U | 9/2015 |
| CN | 105609623 A | 5/2016 |
| CN | 107505769 A | 12/2017 |
| CN | 107819063 A | 3/2018 |
| CN | 208690291 U | 4/2019 |
| CN | 109983589 A | 7/2019 |
| CN | 110379912 A | 10/2019 |
| JP | 5228807 B2 | 7/2013 |
| JP | 2018056367 A | 4/2018 |
| KR | 20150048578 A | 5/2015 |

\* cited by examiner

LIGHT EMITTING DIODE DEVICE AND BACKLIGHT MODULE

CROSS-REFERENCE TO RELATED APPLICATION(S)

The present disclosure claims priority to Chinese Patent Application No. 201910736447.8, filed on Aug. 9, 2019 and entitled "Light Emitting Diode Device and Backlight Module", the contents of which are hereby incorporated by reference in its entirety.

TECHNICAL FIELD

The present disclosure relates to a technical field of light emitting diode (LED) display and illumination, and more particularly, to an LED device and a backlight module.

BACKGROUND

With the rapid development of an LED technology and the gradual improvement in LED luminous efficiency, an LED device is widely applied to various display devices.

As a core luminous assembly of the LED device, a chip can convert electric energy into optical energy to make the LED device luminous. In order to prevent long-time exposure of the chip in the air to cause damage and failure of the chip, an encapsulation structure having a good light transmittance performance is often used to encapsulate the chip of the LED device. Due to the encapsulation structure, the light emitting efficiency of the LED device is reduced, and the light emitting angle, luminescence property and light emitting uniformity of the LED device are affected; and thus, color saturation, brightness and contrast of a displayed pattern of a display device manufactured with the LED device are affected, and a watching experience of a user to the display device is affected.

SUMMARY

Some embodiments of the present disclosure provide an LED device and a backlight module, to solve problems in the art known to inventors that an LED device has low light emitting efficiency and a small light emitting angle to cause a poor light emitting performance, and when a backlight module manufactured with the LED device is used as a display device, color saturation, brightness and contrast of a displayed pattern are affected and a watching experience of a user is affected.

Some embodiments of the present disclosure provide an LED device, the LED device includes a substrate, a chip, an encapsulation structure and a top reflective shielding layer; the chip is disposed on the substrate; the encapsulation structure disposes on the substrate and covers the chip; and the top reflective shielding layer is disposed on the encapsulation structure and located at a central position of an upper surface of the encapsulation structure, and covers a part of the upper surface of the encapsulation structure.

In an exemplary embodiment, a ratio of an area of the part of the upper surface of the encapsulation structure that is covered by the top reflective shielding layer to an area of the upper surface of the encapsulation structure is greater than or equal to 50% and smaller than or equal to 90%.

In an exemplary embodiment, a projection of the top reflective shielding layer on the upper surface of the encapsulation structure is of a rectangular shape or a circular shape.

In an exemplary embodiment, the top reflective shielding layer includes a central layer and an edge layer connected with the central layer integrally and located at a periphery of the central layer, an upper surface of the central layer is of a plane, an upper surface of the edge layer is in smooth transitional connection with the upper surface of the central layer, and the upper surface of the edge layer is in smooth transitional connection with the upper surface of the encapsulation structure.

In an exemplary embodiment, a distance between the upper surface of the central layer and the upper surface of the encapsulation structure is greater than or equal to 0.01 mm and smaller than or equal to 0.3 mm.

In an exemplary embodiment, a peripheral side of the encapsulation structure includes a rough surface having an embossed structure, and the embossed structure includes a plurality of prisms or a plurality of prismatic grooves distributed in an array form; or the embossed structure includes a plurality of pyramids or a plurality of pyramidal grooves distributed in an array form.

In an exemplary embodiment, the light-emitting diode device further includes a peripheral reflective shielding layer, and the peripheral reflective shielding layer covers an outer peripheral side of the encapsulation structure.

In an exemplary embodiment, an outer peripheral side of the peripheral reflective shielding layer comprises a rough surface having an embossed structure, and the embossed structure includes a plurality of prisms or a plurality of prismatic grooves distributed in an array form; or the embossed structure includes a plurality of pyramids or a plurality of pyramidal grooves distributed in an array form.

In an exemplary embodiment, the top reflective shielding layer and the peripheral reflective shielding layer are both made of white oil, a dam glue or a semitransparent gel containing one or more of $TiO_2$, $ZnO$, $ZnS$, lithopone and silver powder.

In an exemplary embodiment, the top reflective shielding layer and the peripheral reflective shielding layer have a light transmittance of greater than or equal to 50% and smaller than or equal to 90%; a content of an amount of one or more of the $TiO_2$, the $ZnO$, the $ZnS$, the lithopone and the silver powder comprised in the top reflective shielding layer in the top reflective shielding layer is greater than or equal to 0.1% and smaller than or equal to 5%; and a content of an amount of one or more of the $TiO_2$, the $ZnO$, the $ZnS$, the lithopone and the silver powder comprised in the peripheral reflective shielding layer in the peripheral reflective shielding layer is greater than or equal to 0.1% and smaller than or equal to 5%.

In an exemplary embodiment, a range of an average light emitting angle having a relative light intensity of 50% or more at a light emitting surface of the light-emitting diode device is greater than or equal to 170°.

An embodiment of the present disclosure provides a backlight module, the backlight module includes a substrate and the above light-emitting diode device; and a plurality of light-emitting diode devices are provided, and the plurality of LED devices are disposed on the substrate in a rectangular form.

By applying the technical solutions of some embodiments of the present disclosure, the top reflective shielding layer is disposed on the encapsulation structure and located at the central position of the upper surface of the encapsulation structure, and the top reflective shielding layer covers a part of the upper surface of the encapsulation structure to partially reflect light emit from a front surface of a chip. In this way, while the LED device emits light on five sides, the top reflective shielding layer can redistribute light emitted by the chip, thereby effectively expanding a light emitting angle of the LED device at a same light intensity, optimizing a light emitting characteristic of the LED device, and improving the practicability of the LED device; and thus, color saturation, brightness and contrast of a displayed pattern of a display device manufactured by using the LED device provided by some embodiments of the present disclosure is effectively improved, and a watching experience of a user is improved.

BRIEF DESCRIPTION OF THE DRAWINGS

The accompanying drawings formed into a part of the present disclosure are described here to provide a further understanding of the present disclosure. The schematic embodiments and description of the present disclosure are adopted to explain the present disclosure, and do not form improper limits to the present disclosure. In the drawings.

The drawings include the following reference signs:

10. substrate, 20. chip, 30. encapsulation structure, 40. top reflective shielding layer, 41. central layer, 42. edge layer, 50. peripheral reflective shielding layer, 60. embossed structure, 61. prism, 62. pyramid, 70. rectangular substrate.

DETAILED DESCRIPTION OF THE EMBODIMENTS

The technical solutions in the embodiments of the present disclosure will be clearly and completely described hereinbelow with the drawings in the embodiments of the present disclosure. It is apparent that the described embodiments are only part of the embodiments of the present disclosure, not all of the embodiments. The following description of at least one exemplary embodiment is only illustrative actually, and is not used as any limitation for the present disclosure and the present disclosure or use thereof. On the basis of the embodiments of the present disclosure, all other embodiments obtained on the premise of no creative work of those of ordinary skill in the art should fall within the scope of protection of the present disclosure.

In order to solve problems in an LED device known to inventors has low light extraction efficiency and a small light emitting angle to cause a poor light emitting performance, and when a backlight module manufactured with the LED device is used as a display device, color saturation, brightness and contrast of a displayed pattern are affected and a watching experience of a user is affected, some embodiments of the present disclosure provides an LED device and a backlight module. The backlight module includes a substrate and LED devices; the LED device is the above-mentioned and under-mentioned LED device; and a plurality of LED devices are provided, and the plurality of LED devices are disposed on the substrate in an array form.

Embodiment 1

Figure 1:
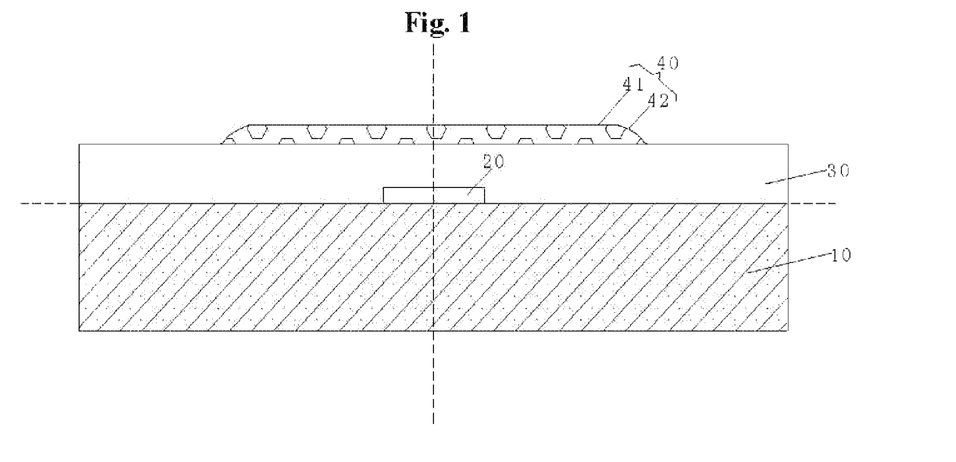
FIG. 1 illustrates a sectional structural schematic diagram of an LED device according to Embodiment 1 of the present disclosure.

As shown in FIG. 1, an LED device includes a substrate 10, a chip 20, an encapsulation structure 30 and a top reflective shielding layer 40; the chip 20 is disposed on the substrate 10; the encapsulation structure 30 covers the substrate 10 and covers the chip 20; and the top reflective shielding layer 40 is disposed on the encapsulation structure 30 and located at a central position of an upper surface of the encapsulation structure 30, and covers a part of the upper surface of the encapsulation structure 30.

The top reflective shielding layer 40 is disposed on the encapsulation structure 30 and located at the central position of the upper surface of the encapsulation structure 30, and the top reflective shielding layer 40 covers a part of the upper surface of the encapsulation structure 30 to reflect a part of light emit from a front surface of the chip 20. In this way, while the LED device emits light on five sides, the top reflective shielding layer 40 can redistribute light emitted by the chip 20, thereby effectively expanding a light emitting angle of the LED device at a same light intensity, optimizing a light emitting characteristic of the LED device, and improving the practicability of the LED device; and thus, color saturation, brightness and contrast of a display picture of a display device manufactured by using the LED device provided by some embodiments of the present disclosure are effectively improved, and a watching experience of a user is improved.

In order to more accurately adjust and optimize the distribution of a light intensity on the upper surface of the encapsulation structure 30, a ratio of an area of the part of the upper surface of the encapsulation structure 30 that is covered by the top reflective shielding layer 40 to an area of the upper surface of the encapsulation structure 30 is greater than or equal to 50% and smaller than or equal to 90%. In this way, the ratio of the area of the part of the upper surface of the encapsulation structure 30 that is covered by the top reflective shielding layer 40 to the area of the upper surface of the encapsulation structure 30 is optimized reasonably, so that the top reflective shielding layer 40 has an enough contact area with the upper surface of the encapsulation structure 30, it is ensured that the top reflective shielding layer 40 can effectively reflect and transmit the light emitted from the front surface of the chip 20 and each light emitting surface of the LED device has a uniform light intensity, and the practicability of the LED device is improved.

In an embodiment, a projection of the top reflective shielding layer 40 on the upper surface of the encapsulation structure 30 is of a rectangular shape or a circular shape. With such a manner, it is ensured that the top reflective shielding layer 40 has a regular contact surface with the upper surface of the encapsulation structure 30, the uniformity of light rays emitted from the front surface of the LED device is improved, and the top reflective shielding layer 40 is formed conveniently.

In the embodiment, as shown in FIG. 1, the top reflective shielding layer 40 includes a central layer 41 and an edge layer 42 connected with the central layer 41 integrally and located at a periphery of the central layer 41, an upper surface of the central layer 41 is of a plane, an upper surface of the edge layer 42 is in smooth transitional connection with the upper surface of the central layer 41, and the upper surface of the edge layer 42 is in smooth transitional connection with the upper surface of the encapsulation structure 30. Therefore, with optimization on a structure of the top reflective shielding layer 40, the light emitting characteristic of the LED device is optimized conveniently, the top reflective shielding layer 40 expands a light emitting angle while effectively reflecting the light emitted from the front surface of the chip 20, and the top reflective shielding layer 40 is stably connected with the encapsulation structure 30. Additionally, the overall appearance aesthetic feeling of the LED device is further improved.

In an embodiment, a distance between the upper surface of the central layer 41 and the upper surface of the encapsulation structure 30 is greater than or equal to 0.01 mm and smaller than or equal to 0.3 mm. In this way, by reasonably optimizing the distance between the upper surface of the central layer 41 and the upper surface of the encapsulation structure 30, it is beneficial to control of an overall thickness of the LED device and a miniature design of the LED device.

Figure 5:
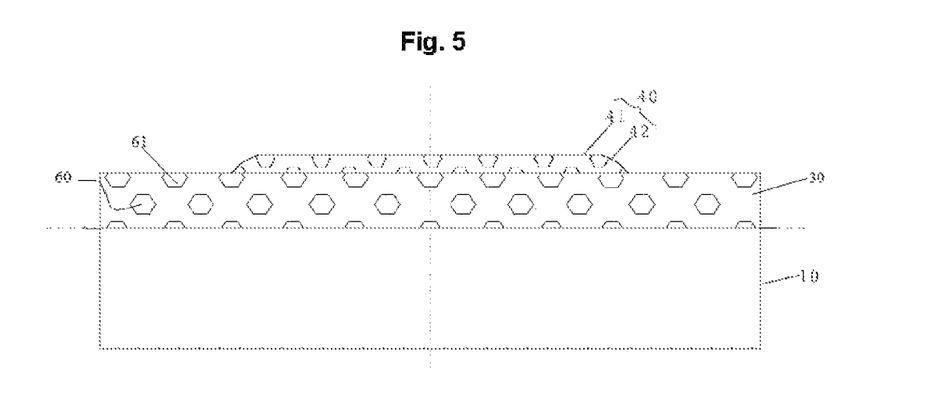
FIG. 5 illustrates an outer structural schematic diagram of an LED device of FIG. 1.

As shown in FIG. 5, it is to be noted that a peripheral side of the encapsulation structure 30 includes a rough surface having an embossed structure 60 in some embodiments.

As shown in FIG. 5, in some embodiments, the embossed structure 60 includes a plurality of prisms 61 or a plurality of prismatic grooves distributed in an array form. When the embossed structure includes the plurality of prisms, a cross section of each prism is of a hexagonal prismatic shape. In this way, with design on an exterior structure of the encapsulation structure 30, the diversion of the light rays is promoted, the light emitting angle of the LED device is increased, and the light emitting performance of the LED device is improved.

In some embodiments, the embossed structure includes a plurality of pyramids or a plurality of pyramidal grooves distributed in an array form. When the embossed structure includes the plurality of pyramids, each pyramid is a triangular pyramid. In this way, with design on an exterior structure of the encapsulation structure 30, the diversion of the light rays is promoted, the light emitting angle of the LED device is increased, and the light emitting performance of the LED device is improved.

Embodiment 2

Figure 2:
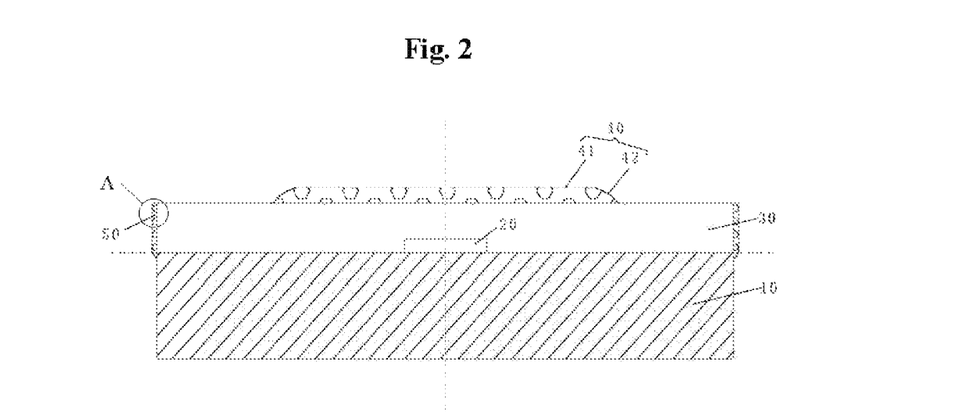
FIG. 2 illustrates a sectional structural schematic diagram of an LED device according to Embodiment 2 of the present disclosure.

As shown in FIG. 2, the difference between the present embodiment and embodiment 1 lies in that the LED device further includes a peripheral reflective shielding layer 50, and the peripheral reflective shielding layer 50 covers an outer peripheral side of the encapsulation structure 30. With such a manner, by disposing the peripheral reflective shielding layer 50 on the outer peripheral side of the encapsulation structure 30 of the LED device, the peripheral light emitting characteristic of the LED device is optimized, the LED device is guaranteed to emit uniform light in a horizontal direction, and the light emitting performance of the LED device is further improved.

As shown in FIG. 2, in some embodiments, an outer peripheral side of the peripheral reflective shielding layer 50 includes a rough surface having an embossed structure 60.

Figure 6:
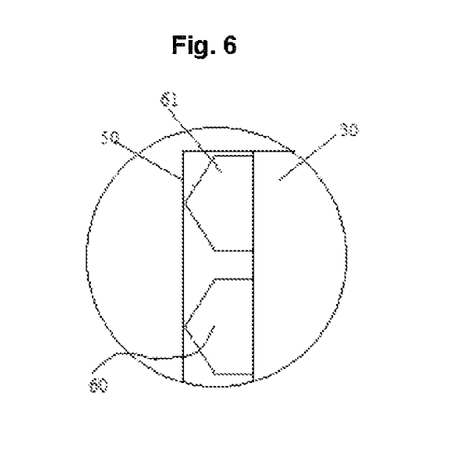
FIG. 6 illustrates an enlarged view of A of an embossed structure in FIG. 2.

As shown in FIG. 6, in some embodiments, the embossed structure includes a plurality of prisms 61 or a plurality of prismatic grooves distributed in an array form. When the embossed structure includes the plurality of prisms, a cross section of each prism is of a hexagonal prismatic shape. In this way, with design on an exterior structure of the peripheral reflective shielding layer 50, it is ensured that the peripheral reflective shielding layer 50 can uniformly divert, along a horizontal direction, light rays emitted from different angles of the chip 20, and the light emitting performance of the LED device is improved.

Figure 7:
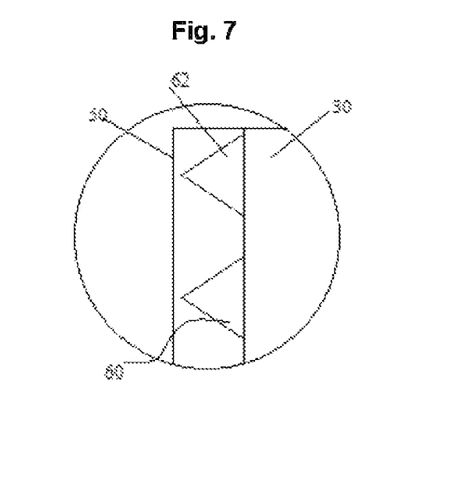
FIG. 7 illustrates an enlarged view of A of another embossed structure in FIG. 2.

As shown in FIG. 7, in some embodiments, the embossed structure includes a plurality of pyramids 62 or a plurality of pyramidal grooves distributed in an array form. When the embossed structure includes the plurality of pyramids, each pyramid is a triangular pyramid. In this way, with design on an exterior structure of the peripheral reflective shielding layer 50, it is ensured that the peripheral reflective shielding layer 50 can uniformly divert, along a horizontal direction, light rays emitted from different angles of the chip 20, and the light emitting performance of the LED device is improved.

In the above embodiments, in order to guarantee that the top reflective shielding layer 40 and the peripheral reflective shielding layer 50 effectively reflect a part of light emitted by the chip 20 and further transmit another part of light, the top reflective shielding layer 40 and the peripheral reflective shielding layer 50 are both made of white oil, a dam glue or a semitransparent gel containing one or more of $TiO_2$, ZnO, ZnS, lithopone and silver powder.

In order to more accurately control the light emitting uniformity of the LED device at a preset light intensity, some embodiments of the present disclosure optimizes a range of a transmittance after the light rays emitted from the chip 20 pass through the encapsulation structure 30, the top reflective shielding layer 40 and the peripheral reflective shielding layer 50. In an embodiment, the top reflective shielding layer 40 and the peripheral reflective shielding layer 50 have a light transmittance of greater than or equal to 50% and smaller than or equal to 90%.

In an embodiment, a content of an amount of one or more of the $TiO_2$, the ZnO, the ZnS, the lithopone and the silver powder contained in the top reflective shielding layer 40 in the top reflective shielding layer 40 is greater than or equal to 0.1% and smaller than or equal to 5%; and a content of an amount of one or more of the $TiO_2$, the ZnO, the ZnS, the lithopone and the silver powder contained in the peripheral reflective shielding layer 50 in the peripheral reflective shielding layer 50 is greater than or equal to 0.1% and smaller than or equal to 5%. In this way, it is ensured that the top reflective shielding layer 40 and the peripheral reflective shielding layer 50 have a sufficient ability of reflecting the light rays, so that the light emitted from the chip 20 is distributed reasonably and the light emitting characteristic of the LED device is optimized.

It is to be noted that the content of the amount of one or more of the TiO2, the ZnO, the ZnS, the lithopone and the silver powder contained in the top reflective shielding layer 40 in the top reflective shielding layer 40 being greater than or equal to 0.1% and smaller than or equal to 5%, and the content of the amount of one or more of the $TiO_2$, the ZnO, the ZnS, the lithopone and the silver powder contained in the peripheral reflective shielding layer 50 in the peripheral reflective shielding layer 50 being greater than or equal to 0.1% and smaller than or equal to 5% refer to a mass ratio in some embodiments of the present disclosure.

In some embodiments of the present disclosure, a range of an average light emitting angle of the LED device having a relative light intensity of 50% or more at a light emitting surface of the LED device is greater than or equal to 170°. Therefore, the relative light intensity of the LED device at a large light emitting angle is distributed uniformly, and a distribution area is very large.

It is to be noted that an encapsulation structure of a flip-chip is used in some embodiments of the present disclosure, so that the light emitting efficiency of the flip-chip is improved.

It is to be noted that a test angle for light intensity distribution of the LED device within a cutting test plane ranges from −90° to 90° in some embodiments of the present disclosure.

Figure 3:
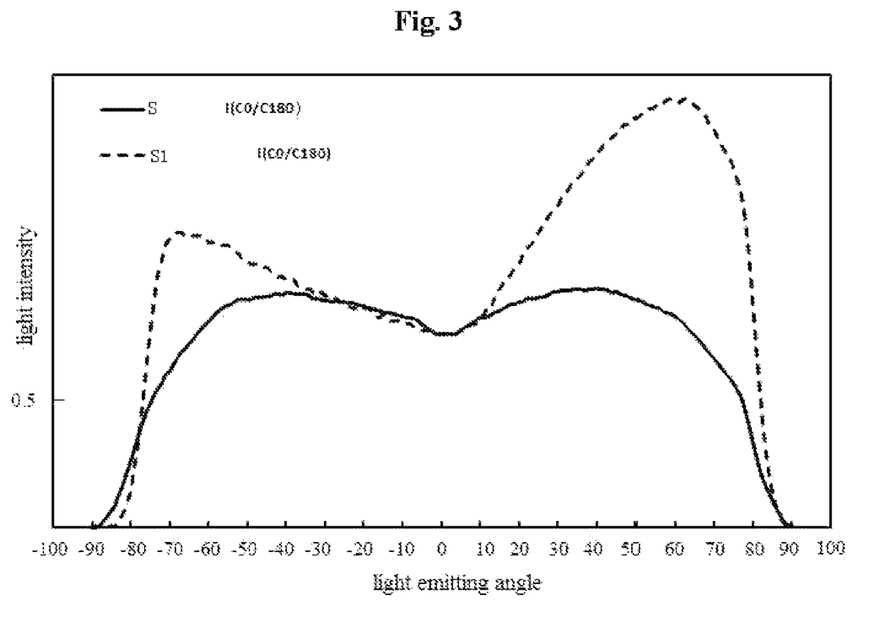
FIG. 3 illustrates a spectral comparison diagram of an LED device in an embodiment of the present disclosure and an LED device known to inventors within a cutting test plane that is along a length direction and passes through a central point of a chip, wherein the S is a light intensity distribution curve of the LED device known to inventors, and the S1 is a light intensity distribution curve of the LED device in an embodiment of the present disclosure.

FIG. 3 is a spectral comparison diagram of an LED device in some embodiments of the present disclosure and an LED device in the art known to inventors within a cutting test plane that is along a length direction of the LED device and passes through a central point of a chip, wherein the S is a light intensity distribution curve of the LED device (a top reflective shielding layer and a peripheral reflective shielding layer are not provided) in the art known to inventors, and the S1 is a light intensity distribution curve of the LED device (a top reflective shielding layer but not a peripheral reflective shielding layer is provided) in some embodiments of the present disclosure.

In the embodiments, as can be seen from FIG. 3, the horizontal coordinate denotes a light emitting angle, the longitudinal coordinate denotes a light intensity, and the S is the light intensity distribution curve of an LED device in the art known to inventors. It can be observed that when the light intensity of the LED device known to inventors is 50%, a line that passes through this point and is parallel to a horizontal axis is intersected with the S at two points, a horizontal coordinate of a left intersection point is −75°, and a horizontal coordinate of a right intersection point is 75°, that is, within a cutting test plane that is along a length direction of the LED device in the art known to inventors and passes through a central point of a chip, the distribution of light rays having the light intensity of 50% or more for the LED device in the art known to inventors ranges from −75° to 75°, with a span of the distribution range being 150°. The S1 is a light intensity distribution curve of an LED device in some embodiments of the present disclosure. It can be observed that when the light intensity of the LED device in some embodiments of the present disclosure is 50%, a line that passes through this point and is horizontal to the horizontal axis is intersected with the S1 at two points, a horizontal coordinate of a left intersection point is −78°, and a horizontal coordinate of a right intersection point is 82°, that is, within a cutting test plane that is along a length direction of the LED device in some embodiments of the present disclosure and passes through the central point of the chip, the distribution of light rays having a light emitting angle of 50% or more for the LED device in some embodiments of the present disclosure ranges from −78° to 82°, with a span of the distribution range being 160°. Therefore, by disposing the top reflective shielding layer 40 at the central position of the upper surface of the encapsulation structure 30 and enabling the top reflective shielding layer 40 to cover a part of the upper surface of the encapsulation structure 30, the light emitting angle of the LED device is expanded effectively and the practicability of the LED device is improved.

Figure 4:
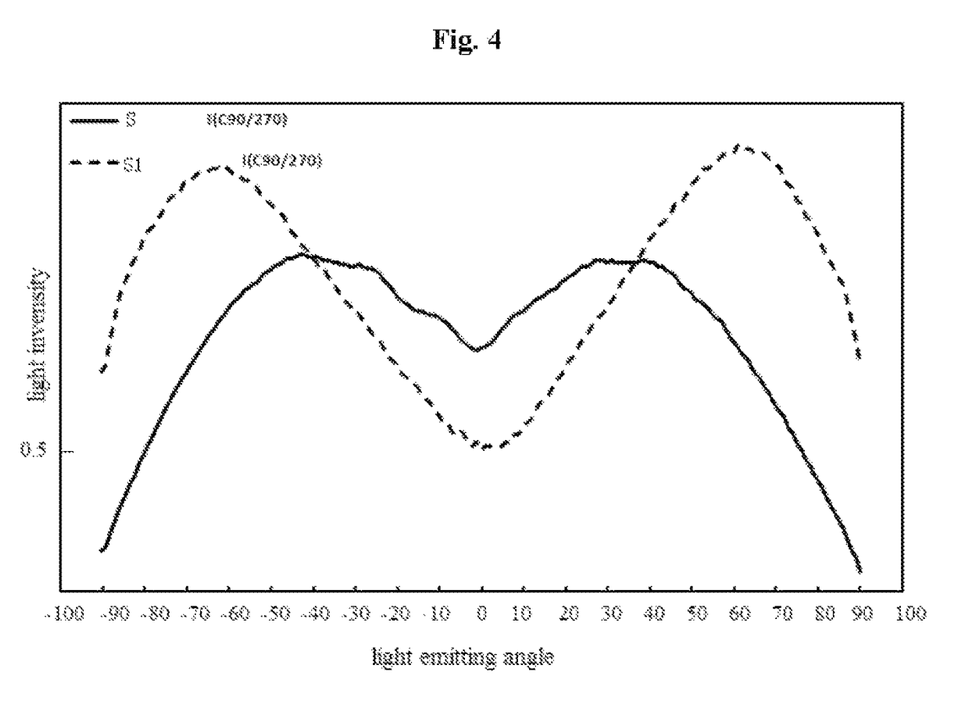
FIG. 4 illustrates a spectral comparison diagram of an LED device in an embodiment of the present disclosure and an LED device known to inventors within a cutting test plane that is along a width direction and passes through a central point of a chip, wherein the S is a light intensity distribution curve of the LED device known to inventors, and the S1 is a light intensity distribution curve of the LED device in an embodiment of the present disclosure.

FIG. 4 is a spectral comparison diagram of an LED device in some embodiments of the present disclosure and an LED device in the art known to inventors within a cutting test plane that is along a width direction and passes through a central point of a chip, wherein the S is a light intensity distribution curve of the LED device (a top reflective shielding layer and a peripheral reflective shielding layer are not provided) in the art known to inventors, and the S1 is a light intensity distribution curve of the LED device (a top reflective shielding layer is disposed, but a peripheral reflective shielding layer is not provided) in some embodiments of the present disclosure.

In the embodiments, as can be seen from FIG. 4, the horizontal coordinate denotes a light emitting angle, the longitudinal coordinate denotes a light intensity, and the S is a light intensity distribution curve of an LED device in the art known to inventors. It can be seen that when the light intensity of the LED device known to inventors is 50%, a line that passes through this point and is parallel to a horizontal axis is intersected with the S at two points, a horizontal coordinate of a left intersection point is −80°, and a horizontal coordinate of a right intersection point is 80°, that is, within a cutting test plane that is along a width direction of the LED device in the art known to inventors and passes through a central point of a chip, the distribution of light rays having the light intensity of 50% or more for the LED device in the art known to inventors ranges from −80° to 80°, with a span of the distribution range being 160°. The S1 is a light intensity distribution curve of an LED device in some embodiments of the present disclosure. It can be observed that when the light intensity of the LED device in some embodiments of the present disclosure is 50%, by passing through this point to make a parallel line of a horizontal axis, the whole S1 curve is located above the parallel line, that is, within a cutting test plane that is along a length direction of the LED device in some embodiments of the present disclosure and passes through the central point of the chip, the distribution of light rays having a light intensity of 50% or more for the LED device in some embodiments of the present disclosure ranges from −90° to 90°, with a span of the distribution range being 180°. Therefore, by disposing the top reflective shielding layer 40 at the central position of the upper surface of the encapsulation structure 30 and enabling the top reflective shielding layer 40 to cover a part of the upper surface of the encapsulation structure 30, the light emitting angle of the LED device is expanded effectively and the practicability of the LED device is improved.

In some embodiments, when a light source distance of the LED device is the same, the LED device provided by some embodiments of the present disclosure has a smaller light mixing distance than the LED device known to inventors, which is helpful to make a display device manufactured with the LED device thin.

In some embodiments, when the light mixing distance is fixed, the number of single light sources of the LED device is reduced with an increased light source distance of the LED device, which is beneficial to reduction of the cost.

Figure 8:
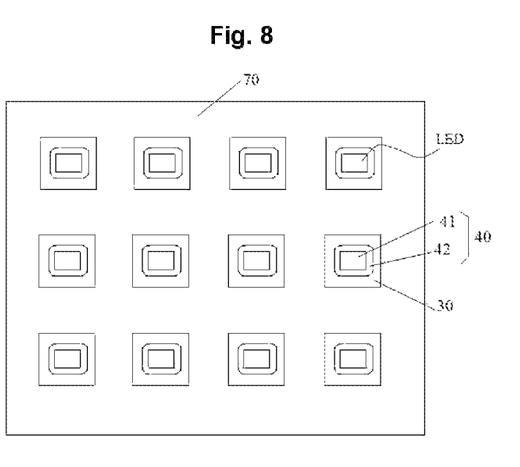
FIG. 8 illustrates a structural schematic diagram of a backlight module.

As shown in FIG. 8, some embodiments of the present disclosure further provide a backlight module, which uses the above LED device; the backlight module includes a substrate 70; and a plurality of LED devices are distributed on the substrate in a matrix form. In case of a same light source distance, a light mixing distance is smaller, so that a display device is manufactured to be thinner. Or when the light mixing distance is fixed, the number of single light sources of the LED device is reduced with an increased light source distance, which is helpful to lower the cost.

It is to be noted that terms used herein only aim to describe specific implementation manners, and are not intended to limit exemplar implementations of this present disclosure. Unless otherwise directed by the context, singular forms of terms used herein are intended to include plural forms. Besides, it will be also appreciated that when terms "contain" and/or "include" are used in the description, it is indicated that features, steps, operations, devices, assemblies and/or a combination thereof exist.

Unless otherwise specified, relative arrangements of components and steps elaborated in these embodiments, numeric expressions and numeric values do not limit the scope of the present disclosure. Furthermore, it should be understood that for ease of descriptions, the size of each part shown in the drawings is not drawn in accordance with an actual proportional relation. Technologies, methods and devices known by those skilled in the related art may not be discussed in detail. However, where appropriate, the technologies, the methods and the devices shall be regarded as part of the authorized description. In all examples shown and discussed herein, any specific values shall be interpreted as only exemplar values instead of limited values. As a result, other examples of the exemplar embodiments may have different values. It is to be noted that similar marks and letters represent similar items in the following drawings. As a result, once a certain item is defined in one drawing, it is unnecessary to further discuss the certain item in the subsequent drawings.

For ease of description, spatial relative terms such as "over", "above", "on an upper surface" and "upper" may be used herein for describing a spatial position relation between a device or feature and other devices or features shown in the drawings. It will be appreciated that the spatial relative terms aim to contain different orientations in usage or operation besides the orientations of the devices described in the drawings. For example, if the devices in the drawings are inverted, devices described as "above other devices or structures" or "over other devices or structures" will be located as "below other devices or structures" or "under other devices or structures". Thus, an exemplar term "above" may include two orientations namely "above" and "below". The device may also be located in other different modes (rotated by 90 degrees or located in other orientations), and spatial relative descriptions used herein are correspondingly explained.

It is to be noted that terms used herein only aim to describe specific implementation manners, and are not intended to limit exemplar implementations of this present disclosure. Unless otherwise explicitly directed by the context, singular forms of terms used herein are intended to include plural forms. Besides, it will be also appreciated that when terms "contain" and/or "include" are used in the description, it is indicated that features, steps, operations, devices, assemblies and/or a combination thereof exist.

It should be noted that, terminologies such as "first" and "second" in the specification, claims and accompanying drawings of the present disclosure are only used to distinguish similar objects, rather than to describe a special order or a precedence order. It should be understood that data used in such a way may be interchangeable in a certain cases, such that the embodiments of the present disclosure described here can be implemented in an order other than those illustrated or described here.

The above are only some embodiments of the present disclosure, not intended to limit the present disclosure. As will occur to those skilled in the art, the present disclosure is susceptible to various modifications and changes. Any modification, equivalent replacement, improvement and the like made within a spirit and a principle of the present disclosure should be included in a protection scope of the present disclosure.

What is claimed is:

1. A light emitting diode device, comprising:
   a substrate;
   a chip, the chip being disposed on the substrate;
   an encapsulation structure, the encapsulation structure disposed on the substrate and covering the chip; and
   a top reflective shielding layer, the top reflective shielding layer being disposed on the encapsulation structure and located at a central position of an upper surface of the encapsulation structure, and covering a part of the upper surface of the encapsulation structure;
   wherein the top reflective shielding layer comprises a central layer and an edge layer connected with the central layer integrally and located at a periphery of the central layer, an upper surface of the central layer is of a plane, an upper surface of the edge layer is in smooth transitional connection with the upper surface of the central layer, and the upper surface of the edge layer is in smooth transitional connection with the upper surface of the encapsulation structure.

2. The light emitting diode device as claimed in claim 1, wherein a ratio of an area of the part of the upper surface of the encapsulation structure that is covered by the top reflective shielding layer to an area of the upper surface of the encapsulation structure is greater than or equal to 50% and smaller than or equal to 90%.

3. The light emitting diode device as claimed in claim 1, wherein a projection of the top reflective shielding layer on the upper surface of the encapsulation structure is of a rectangular shape or a circular shape.

4. The light emitting diode device as claimed in claim 1, wherein a distance between the upper surface of the central layer and the upper surface of the encapsulation structure is greater than or equal to 0.01 mm and smaller than or equal to 0.3 mm.

5. The light emitting diode device as claimed in claim 1, wherein a peripheral side of the encapsulation structure comprises a rough surface having an embossed structure,
   and the embossed structure comprises a plurality of prisms or a plurality of prismatic grooves distributed in an array form; or
   the embossed structure comprises a plurality of pyramids or a plurality of pyramidal grooves distributed in an array form.

6. The light emitting diode device as claimed in claim 1, wherein a range of an average light emitting angle having a relative light intensity of 50% or more at a light emitting surface of the light-emitting diode device is greater than or equal to 170°.

7. A backlight module, comprising a substrate and the light emitting diode device as claimed in claim 1; and a plurality of light emitting diode devices are provided, and the plurality of light emitting diode devices are disposed on the substrate in a rectangular form.

8. The backlight module as claimed in claim 7, wherein a ratio of an area of the part of the upper surface of the encapsulation structure that is covered by the top reflective shielding layer to an area of the upper surface of the encapsulation structure is greater than or equal to 50% and smaller than or equal to 90%.

9. The light-emitting diode device as claimed in claim 7, wherein a projection of the top reflective shielding layer on the upper surface of the encapsulation structure is of a rectangular shape or a circular shape.

10. The light-emitting diode device as claimed in claim 7, wherein a distance between the upper surface of the central layer and the upper surface of the encapsulation structure is greater than or equal to 0.01 mm and smaller than or equal to 0.3 mm.

11. The light-emitting diode device as claimed in claim 7, wherein a peripheral side of the encapsulation structure comprises a rough surface having an embossed structure, and the embossed structure comprises a plurality of prisms or a plurality of prismatic grooves distributed in an array form; or the embossed structure comprises a plurality of pyramids or a plurality of pyramidal grooves distributed in an array form.

12. The light emitting diode device as claimed in claim 1, wherein the light-emitting diode device further comprises a peripheral reflective shielding layer, and the peripheral reflective shielding layer covers an outer peripheral side of the encapsulation structure.

13. The light emitting diode device as claimed in claim 12, wherein an outer peripheral side of the peripheral reflective shielding layer comprises a rough surface having an embossed structure, and the embossed structure comprises a plurality of prisms or a plurality of prismatic grooves distributed in an array form; or the embossed structure comprises a plurality of pyramids or a plurality of pyramidal grooves distributed in an array form.

14. The light emitting diode device as claimed in claim 13, wherein the top reflective shielding layer and the peripheral reflective shielding layer are both made of white oil, a dam glue or a semitransparent gel containing one or more of $TiO_2$, $ZnO$, $ZnS$, lithopone and silver powder.

15. The light emitting diode device as claimed in claim 12, wherein the top reflective shielding layer and the peripheral reflective shielding layer are both made of white oil, a dam glue or a semitransparent gel containing one or more of $TiO_2$, $ZnO$, $ZnS$, lithopone and silver powder.

16. The light emitting diode device as claimed in claim 15, wherein the top reflective shielding layer and the peripheral reflective shielding layer have a light transmittance of greater than or equal to 50% and smaller than or equal to 90%;

a content of an amount of one or more of the $TiO_2$, the $ZnO$, the $ZnS$, the lithopone and the silver powder comprised in the top reflective shielding layer in the top reflective shielding layer is greater than or equal to 0.1% and smaller than or equal to 5%; and a content of an amount of one or more of the $TiO_2$, the $ZnO$, the $ZnS$, the lithopone and the silver powder comprised in the peripheral reflective shielding layer in the peripheral reflective shielding layer is greater than or equal to 0.1% and smaller than or equal to 5%.

* * * * *